United States Patent
Hsu (10) Patent No.: US 10,830,794 B2
(45) Date of Patent: Nov. 10, 2020

(54) ACTIVE WAFER PROBER PREHEAT-PRECOOL SYSTEM AND METHOD FOR TESTING WAFERS

(71) Applicant: Hermes-Epitek Corp., Taipei (TW)

(72) Inventor: Wen-Yuan Hsu, Hsinchu (TW)

(73) Assignee: HERMES-EPITEK CORP., Taipei (TW)

( * ) Notice: Subject to any disclaimer, the term of this patent is extended or adjusted under 35 U.S.C. 154(b) by 162 days.

(21) Appl. No.: 15/971,321

(22) Filed: May 4, 2018

(65) Prior Publication Data

US 2018/0321279 A1 Nov. 8, 2018

(30) Foreign Application Priority Data

May 5, 2017 (TW) .............. 106114978 A (51) Int. Cl.
*G01R 1/44* (2006.01)
*G01R 31/26* (2020.01)
(Continued)

(52) U.S. Cl.
CPC ........... *G01R 1/44* (2013.01); *G01R 1/07307* (2013.01); *G01R 31/2601* (2013.01); *G01R 31/2865* (2013.01); *G01R 31/2875* (2013.01); *G01R 31/2877* (2013.01); *G01R 31/2891* (2013.01); *G01R 31/2893* (2013.01); *H01L 21/67109* (2013.01)

(58) Field of Classification Search
CPC .... G01R 1/44; G01R 31/2875; G01R 31/281; G01R 31/2893; G01R 31/2865
See application file for complete search history.

(56) References Cited

U.S. PATENT DOCUMENTS 6,455,335 B1 * 9/2002 Kohno ............... G01R 3/00
  438/14
6,677,771 B2 * 1/2004 Zhou ............... G01R 1/07314
  324/750.25

(Continued)

FOREIGN PATENT DOCUMENTS

JP   2001319953 A   11/2001
JP   2003344478 A   12/2003
(Continued)

*Primary Examiner* — Dominic E Hawkins
(74) *Attorney, Agent, or Firm* — Muncy, Geissler, Olds & Lowe, PC (57) ABSTRACT

An active wafer prober preheat-precool system comprises a wafer loading unit used to load at least one wafer; a probe card disposed corresponding to the wafer loading unit and used to test the wafer; a carrying mechanism including a central connector corresponding to the wafer loading unit and having a first opening, wherein the probe card is connected with the central connector and faces the wafer loading unit through the first opening; a peripheral connector having a second opening, wherein the central connector is detachably disposed inside the second opening; and a first temperature regulation unit disposed in the peripheral connector; and a control unit electrically connected with the first temperature regulation unit and controlling the first temperature regulation unit to adjust the temperature of the peripheral connector. The present invention also discloses a method for testing wafers.

8 Claims, 5 Drawing Sheets

(51) Int. Cl.
*G01R 1/073* (2006.01)
*G01R 31/28* (2006.01)
H01L 21/67 (2006.01)

(56) References Cited

U.S. PATENT DOCUMENTS

| | | | | |
|---|---|---|---|---|
| 7,791,361 B2* | 9/2010 | Karklin | ............. | G01R 1/07364 |
| | | | | 324/762.01 |
| 2011/0241711 A1* | 10/2011 | Teich | ................ | G01R 31/2874 |
| | | | | 324/750.03 |
| 2015/0137842 A1* | 5/2015 | Murakami | ............. | G01R 1/067 |
| | | | | 324/750.03 |
| 2018/0017594 A1* | 1/2018 | Tamura | ............. | G01R 1/06722 |

FOREIGN PATENT DOCUMENTS

| JP | 2006108456 A | 4/2006 |
|---|---|---|
| TW | 200935536 A | 8/2009 |

* cited by examiner

ACTIVE WAFER PROBER PREHEAT-PRECOOL SYSTEM AND METHOD FOR TESTING WAFERS

BACKGROUND OF THE INVENTION

1. Field of the Invention

The present invention relates to an active wafer prober preheat-precool system and a method for testing wafers, particularly to an active wafer prober preheat-precool system and a method for testing wafers, which can control temperature actively for preventing micro curvature of prober thus enhance stabilization of the testing system.

2. Description of the Prior Art

During wafer tests, the wafers are usually tested at different temperatures to verify the malfunction modes at different temperatures. Wafer tests generally include an ambient temperature test and a high temperature test, which all need to preheat the probe card, whereby the probe card is thermally expanded to reach a thermal equilibrium with the position of the probes being raised. It is usually only the element carrying the wafer that is heated in the preheat process. Therefore, the elements and probe card that are disposed in the central region of the wafer test apparatus will reach thermal equilibrium earlier, and the elements that are disposed in the periphery of the wafer test apparatus will reach thermal equilibrium later. The thermal distribution inbalance causes the probes to slightly rise and distort for a long time and brings about incorrect test results. In the precool process, the elements and the probe card that are disposed in the central region of the wafer test apparatus will reach the target cooling temperature and begin to contract earlier, and the elements that are disposed in the periphery of the wafer test apparatus will cool down later. Thus, different elements respectively have different shrinkages, which would influence the test results.

In the conventional technology, the wafers in the production line are scheduled to be tested in the machines at fixed temperatures to avoid the problem of unbalanced thermal distribution. Alternatively, the position of the probe card or wafer is slightly modified to decrease incorrect results. However, if the extents of the element distortions can be learned beforehand, the wafer test process should be undertaken favorably, and much time will be saved.

SUMMARY OF THE INVENTION

One objective of the present invention is to provide an active wafer prober preheat-precool system and a method for testing wafers, which use a temperature regulation unit to modify the temperature of the peripheral region of the probe card beforehand to make the probe card and the peripheral region thereof fast reach thermal equilibrium, whereby to prevent from measurement errors caused by unbalanced thermal distribution.

To achieve the abovementioned objective, the present invention proposes an active wafer prober preheat-precool system, which comprises a wafer loading unit used to load at least one wafer to be tested; a probe card arranged corresponding to the wafer loading unit and used to test wafers; a carrying mechanism, which includes a central connector, a peripheral connector and a first temperature regulation unit, wherein the central connector is corresponding to the wafer loading unit and has a first opening, and wherein the probe card is connected with the central connector and faces the wafer loading unit through the first opening, and wherein the peripheral connector has a second opening, and wherein the central connector is detachably installed in the second opening, and wherein the first temperature regulation unit is disposed in the peripheral connector; and a control unit electrically connected with the temperature regulation unit and controlling the first temperature regulation unit to modify the temperature of the peripheral connector.

The present invention also proposes a method for testing wafers, which comprises steps: providing a wafer test apparatus with an active wafer prober preheat-precool system, which comprises a wafer loading unit and a carrying mechanism that includes a central connector and a peripheral connector, wherein the central connector is corresponding to the wafer loading unit and has a first opening, and wherein the probe card is connected with the central connector and faces the wafer loading unit through the first opening, and wherein the peripheral connector has a second opening, and wherein the central connector is installed in the second opening; placing a wafer on the wafer loading unit; modifying the temperature of the wafer to a first temperature; modifying the temperature of the probe card to a second temperature; modifying the temperature of the peripheral connector to a third temperature; and using the probe card to test the wafer.

Below, embodiments are described in detail in cooperation with the attached drawings to make easily understood the objectives, technical contents, characteristics and accomplishments of the present invention.

DESCRIPTION OF THE PREFERRED EMBODIMENTS

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Figure 1:
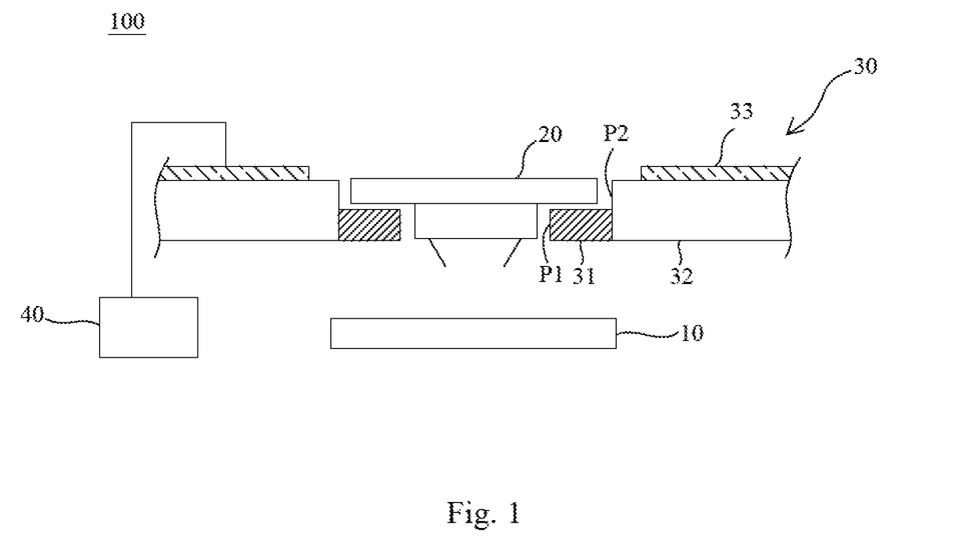
FIG. 1 is a diagram schematically showing an active wafer prober preheat-precool system according to one embodiment of the present invention.

Refer to FIG. 1 a diagram schematically showing an active wafer prober preheat-precool system according to one embodiment of the present invention. The active wafer prober preheat-precool system 100 of the present invention comprises a wafer loading unit 10, a probe card 20, a carrying mechanism 30 and a control unit 40. The wafer loading unit 10 is used to load at least one wafer (not shown in the drawing) to be tested. The probe card 20 is arranged corresponding to the wafer loading unit 10 and used to test wafers. The carrying mechanism 30 includes a central connector 31, a peripheral connector 32 and a first temperature regulation unit 33. The central connector 31 is corresponding to the wafer loading unit 10 and has a first opening P1. The probe card 20 is connected with the central connector 31 and faces the wafer loading unit 10 through the first opening P1. The peripheral connector 32 has a second opening P2. The central connector 31 is detachably installed in the second opening P2. Therefore, the probe card 20 can be replaced via detaching the central connector 31 where the probe card 20 is connected. The first temperature regulation unit 33 is installed in the peripheral connector 32 in a contact or non-contact way to modify the temperature of the peripheral connector 32. For example, the first temperature regulation unit 33 modifies the temperature of the peripheral connector 32 in a conduction way, a radiation way, or an infrared way. In detail, the control unit 40 is electrically connected with the first temperature regulation unit 33 to control the first temperature regulation unit 33 and modify the temperature of the peripheral connector 32. In a preferred embodiment, the first temperature regulation unit 33 is installed in one surface of the peripheral connector 32, which is opposite to the wafer loading unit 10.

Figure 2A:
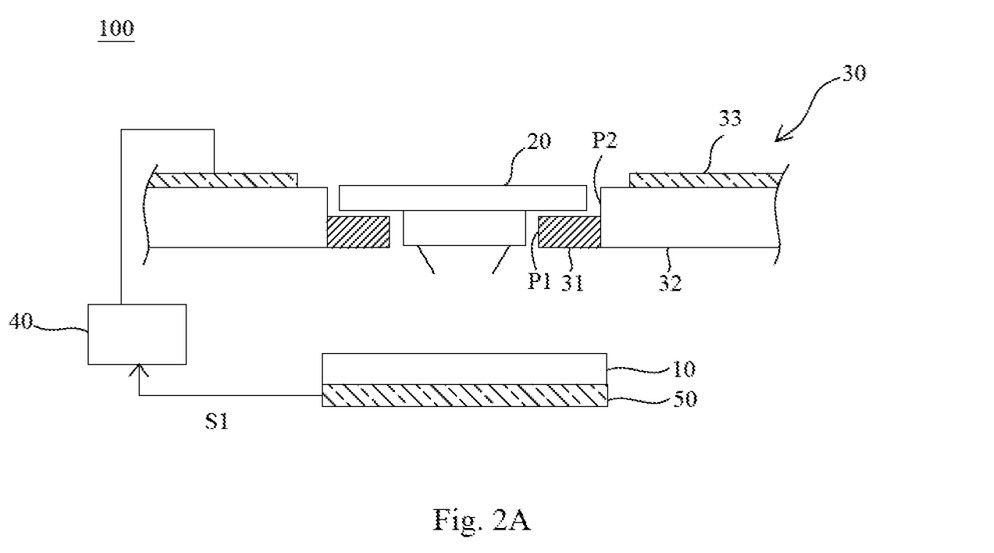
FIG. 2A is a diagram schematically showing an active wafer prober preheat-precool system according to another embodiment of the present invention.
Figure 2B:
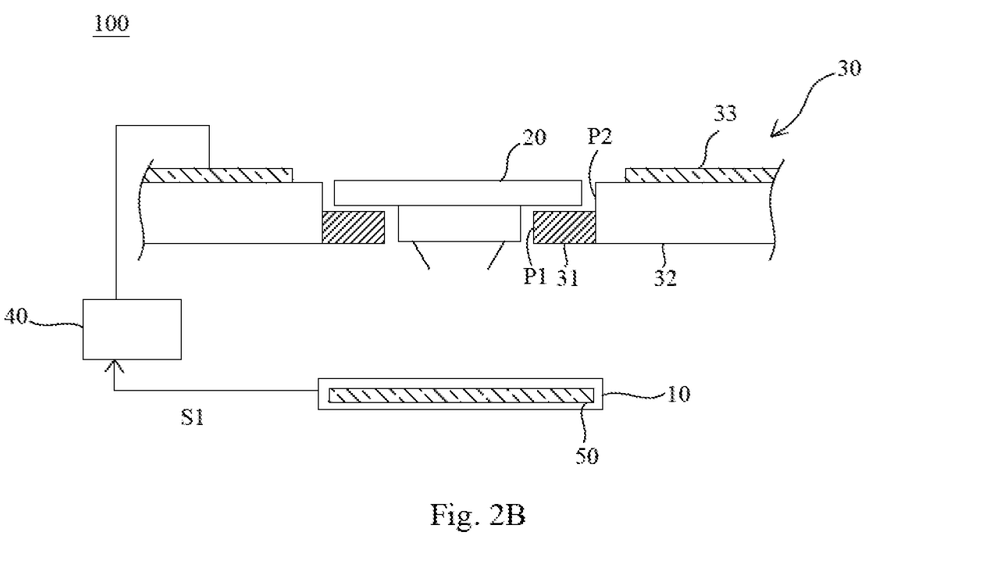
FIG. 2B is a diagram schematically showing an active wafer prober preheat-precool system according to yet another embodiment of the present invention.

Refer to FIG. 2A and FIG. 2B. In some embodiments, the active wafer prober preheat-precool system 100 of the present invention further comprises a second temperature regulation unit 50, which is used to modify the temperature of the wafer loading unit 10, the probe card 20 and the central connector 31. In detail, the second temperature regulation unit 50 may heat the wafer loading unit 10 in advance and then heat the probe card 20 and the central connector 31. Alternatively, the second temperature regulation unit 50 may cool the wafer loading unit 10 in advance and then cool the probe card 20 and the central connector 31. In FIG. 2A, the second temperature regulation unit 50 is disposed below the wafer loading unit 10. However, the present invention is not limited by the embodiment shown in FIG. 2A. As shown in FIG. 2B, the second temperature regulation unit 50 is disposed inside the wafer loading unit 10. In these embodiments, the second temperature regulation unit 50 is electrically connected with the control unit 40; the control unit 40 receives a first control signal S1 sent out by the second temperature regulation unit 50 and controls the first temperature regulation unit 33 according to the first control signal S1. In one embodiment, the active wafer prober preheat-precool system 100 of the present invention further comprises an external temperature regulation unit (not shown in the drawing) used to modify the temperature of the wafer loading unit 10. In one embodiment, the external temperature regulation unit modifies the temperature of the wafer loading unit 10 in a convectional way. For example, the external temperature regulation unit provides hot or cool air flow to increase or decrease the temperature of the wafer loading unit 10.

Figure 3:
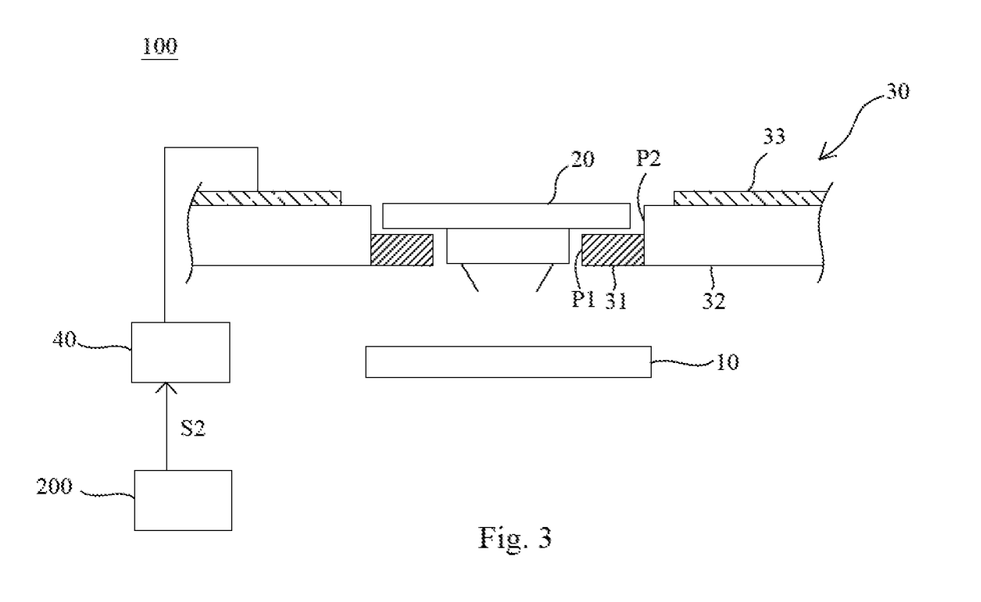
FIG. 3 is a diagram schematically showing an active wafer prober preheat-precool system according to still another embodiment of the present invention.
Figure 4A:
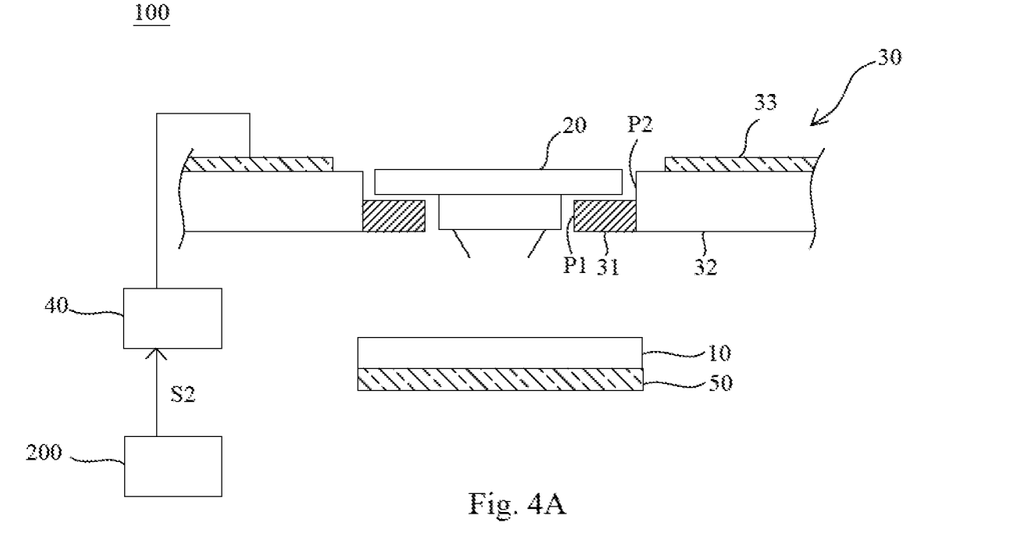
FIG. 4A is a diagram schematically showing an active wafer prober preheat-precool system according to a further embodiment of the present invention.
Figure 4B:
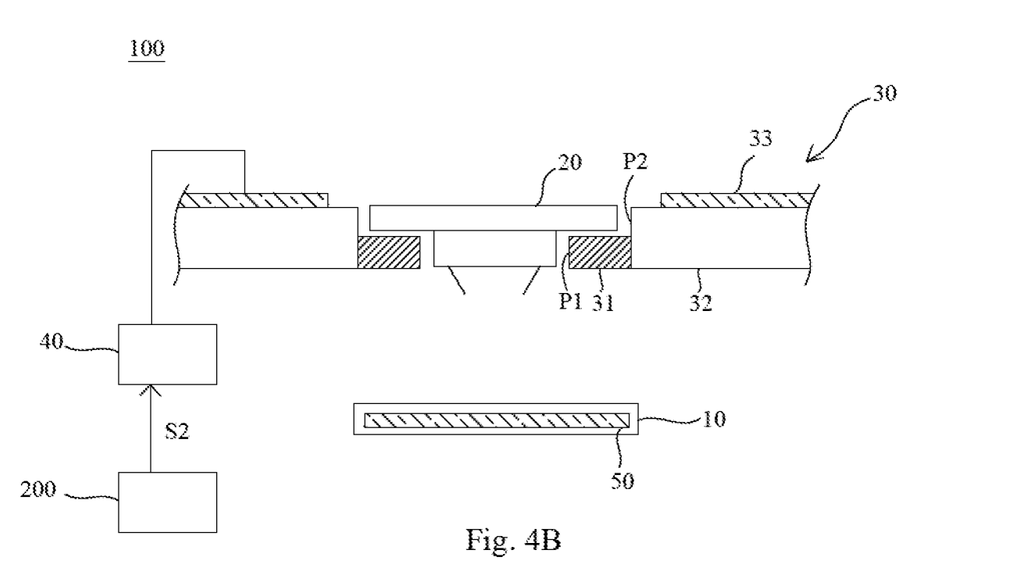
FIG. 4B is a diagram schematically showing an active wafer prober preheat-precool system according to further another embodiment of the present invention.

Refer to FIG. 3. In one embodiment, the control unit 40 receives a second control signal S2 from an external electronic device 200 (such as the test machine or a monitoring machine) and controls the first temperature regulation unit 33 according to the second control signal S2. Refer to FIG. 4A and FIG. 4B. In one embodiment where the active wafer prober preheat-precool system 100 comprises the second temperature regulation unit 50, the external electronic device 200 transmits the second control signal S2 to the control unit 40, and the control unit 40 controls the first temperature regulation unit 33 according to the second control signal S2.

While a high temperature test is undertaken, the second temperature regulation unit 50 modifies the temperature of the probe card 20 and the central connector 31 to a temperature of 85-300° C., preferably 85-200° C. At the same time, the second temperature regulation unit 50 transmits the first control signal S1 to the control unit 40, or the external electronic device 200 transmits the second control signal S2 to the control unit 40. Then, the control unit 40 controls the first temperature regulation unit 33 to increase the temperature of the peripheral connector 32 according to the first control signal S1 or the second control signal S2. While a low temperature test is undertaken, the second temperature regulation unit 50 modifies the temperature of the probe card 20 and the central connector 31 to a temperature of −75-85° C., preferably −55-85° C. At the same time, the second temperature regulation unit 50 transmits the first control signal S1 to the control unit 40, or the external electronic device 200 transmits the second control signal S2 to the control unit 40. Then, the control unit 40 controls the first temperature regulation unit 33 to decrease the temperature of the peripheral connector 32 according to the first control signal S1 or the second control signal S2.

Table.1 lists the characteristics of the heated elements of the active wafer prober preheat-precool system.

TABLE 1

| | Distortion extent | Proportion of thermally-induced distortion | Speed of stabilization | Preheat time |
|---|---|---|---|---|
| Probe card | large | 50% | fast | 20-120 minutes |
| Central connector | large | 40% | fast | 20-120 minutes |
| Peripheral connector | small | 10% | slow | 120-360 minutes |

It is learned from Table.1: although the thermally-induced distortion of the peripheral connector is smaller, the stabilization speed thereof is slower, and the preheat time thereof is longer. If the peripheral connector is preheated or precooled after the probe card and the central connector have reached thermal equilibrium, it will consume much time. In the active wafer prober preheat-precool system of the present invention, the control unit receives a signal to control the temperature regulation unit disposed on the peripheral connector to modify the temperature of the peripheral connector the moment the temperature of the probe card and the central connector is modified. In other words, while the temperature of the probe card and the central connector is modified, the temperature of the peripheral connector is also modified simultaneously. Therefore, the present invention can solve the problem of the distortion of the peripheral connector and eliminate the factor causing variance in advance. Further, compared with the conventional technology, the present invention can save the time for preheat or precool and accelerate the process of wafer test.

Figure 5:
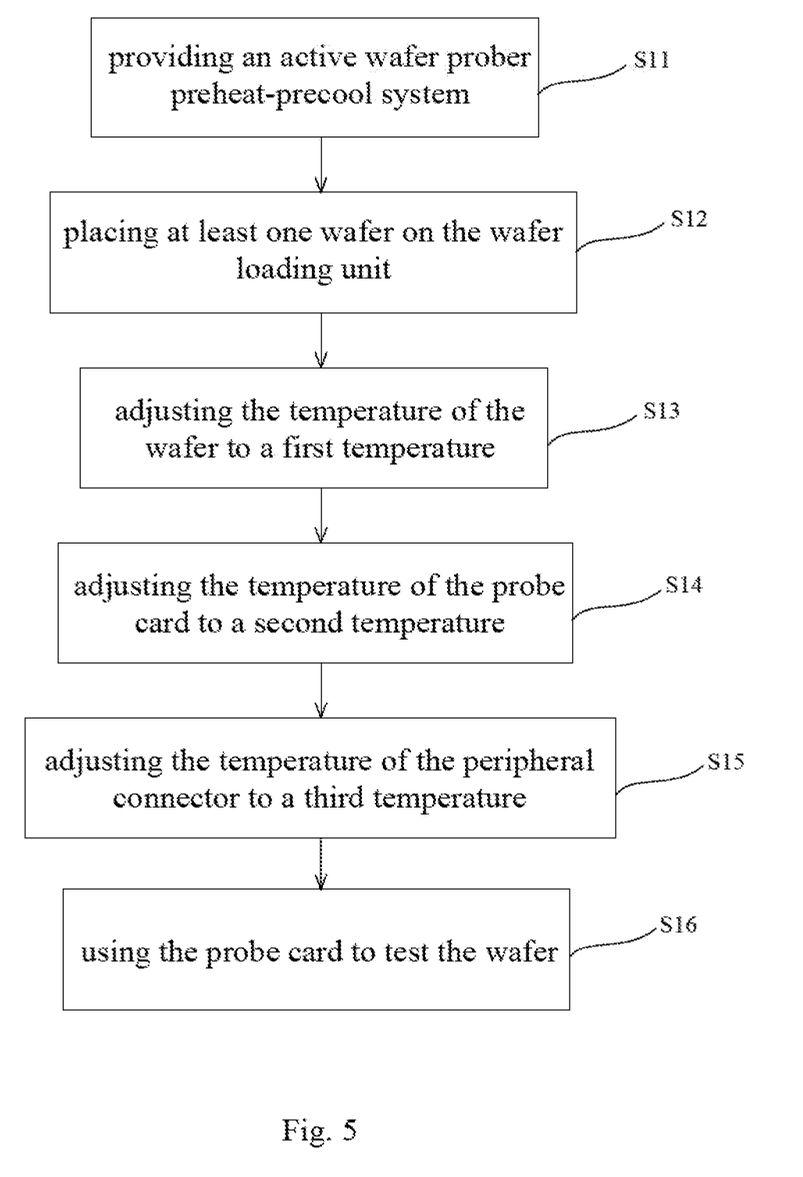
FIG. 5 is a flowchart of a method of testing wafers according to one embodiment of the present invention.

Below is described a method of using the abovementioned active wafer prober preheat-precool system to test wafers. Refer to FIG. 5 a flowchart of a method of testing wafers according to one embodiment of the present invention. The method of the present invention comprises Steps S11-S16. In Step S11, provide an active wafer prober preheat-precool system, which comprises a wafer loading unit and a carrying mechanism. The structure of the active wafer prober preheat-precool system has been described in detail hereinbefore and will not repeat herein. In Step S12, place at least one wafer on the wafer loading unit. In Step S13, adjust the temperature of the wafer to a first temperature. In Step S14, adjust the temperature of the probe card to a second temperature, wherein the second temperature regulation unit may be used to adjust the temperature of the probe card and transmit a control signal to the control unit. In Step S15, adjust the temperature of the peripheral connector of the active wafer prober preheat-precool system to a third temperature, wherein the control unit may be used to control the temperature of the peripheral connector to the third temperature according to the control signal. In Step S16, use the probe card to test the wafer.

In the present invention, the steps of adjusting the temperatures of the elements are not necessarily undertaken by the sequence mentioned above but may be undertaken in another sequence according to requirement. For example, the step of adjusting the peripheral connector may be undertaken before the step of adjusting the temperature of the probe card. Alternatively, the steps of adjusting the peripheral connector and the probe card may be undertaken simultaneously.

Besides, at least one of the first, second, and third temperatures may range from −75 to 300° C. For example, while a high temperature test is undertaken, the second temperature regulation unit may adjust the temperatures of the probe card and the central connector to a temperature of 85-300° C. and transmit a control signal to the control unit. Alternatively, an external electronic device may transmit a control signal to the control unit. According to the control signal, the control unit controls the first temperature regulation unit to raise the temperature of the peripheral connector, whereby is achieved the target of preheat. While a normal temperature test or a low temperature test is undertaken, the second temperature regulation unit may adjust the temperatures of the probe card and the central connector to a temperature ranging from −75 to 85° C. and transmit a control signal to the control unit. Alternatively, an external electronic device may transmit a control signal to the control unit. According to the control signal, the control unit controls the first temperature regulation unit to lower the temperature of the peripheral connector, whereby is achieved the target of precool. In the present invention, the second temperature may be close to the third temperature. Preferably, the difference between the second temperature and the third temperature ranges from 0 to 50°C.

In conclusion, the present invention proposes an active wafer prober preheat-precool system and a method for testing wafers, which actively control the temperature to solve the problem of distortions in advance, whereby to save the time for preheating or precooling components. The present invention enables the units of the active wafer prober preheat-precool system to fast reach thermal equilibrium via using the control unit to control the temperature regulation unit installed in the peripheral connector to instantly adjust the temperature of the peripheral connector according to a control signal while the temperatures of the probe card and the central connector are adjusted. Therefore, the present invention can reduce the cost of time and avoid the malfunctions caused by uncontrollable distortion.

What is claimed is:

1. An active wafer prober preheat-precool system comprising
   a wafer loading unit used to load at least one wafer;
   a probe card disposed corresponding to the wafer loading unit and used to test the at least one wafer;
   a carrying mechanism including
   a central connector corresponding to the wafer loading unit and having a first opening, wherein the probe card is connected with the central connector and faces the wafer loading unit through the first opening;
   a peripheral connector having a second opening, wherein the central connector is detachably disposed inside the second opening;
   a first temperature regulation unit disposed in the peripheral connector; and
   a control unit electrically connected with the first temperature regulation unit and controlling the first temperature regulation unit to adjust a temperature of the peripheral connector in a conduction way or a radiation way; and
   a second temperature regulation unit electrically connected with the control unit and used to adjust temperatures of the probe card and the central connector.

2. The active wafer prober preheat-precool system according to claim 1, wherein the control unit receives a control signal sent out by the second temperature regulation unit and controls the first temperature regulation unit according to the control signal.

3. The active wafer prober preheat-precool system according to claim 1, wherein the control unit receives a control signal sent out by an external electronic device and controls the first temperature regulation unit according to the control signal.

4. The active wafer prober preheat-precool system according to claim 1, wherein the first temperature regulation unit adjusts the temperature of the peripheral connector to range from 10 to 200°C.

5. The active wafer prober preheat-precool system according to claim 1, wherein the first temperature regulation unit is disposed on one side of the peripheral connector, which is opposite to the wafer loading unit.

6. A method for testing wafers, comprising steps as following:
   providing an active wafer prober preheat-precool system, which comprises a wafer loading unit and a carrying mechanism, wherein the carrying mechanism includes:
   a central connector corresponding to the wafer loading unit and having a first opening, wherein a probe card is connected with the central connector and faces the wafer loading unit through the first opening; and a peripheral connector having a second opening, wherein the central connector is disposed inside the second opening;

placing at least one wafer on the wafer loading unit;

adjusting a temperature of the at least one wafer to a first temperature;

adjusting a temperature of the probe card to a second temperature;

adjusting a temperature of the peripheral connector to a third temperature in a conduction way or a radiation way; and using the probe card to test the at least one wafer;

wherein the step of adjusting the temperature of the peripheral connector is before the step of adjusting the temperature of the probe card; alternatively, the step of adjusting the temperature of the peripheral connector and the step of adjusting the temperature of the probe card are undertaken simultaneously.

7. The method for testing wafers according to claim 6, wherein a difference between the second temperature and the third temperature ranges from 0 to 50°C.

8. The method for testing wafers according to claim 6, wherein at least one of the first temperature, the second temperature and the third temperature ranges from −75 to 300°C.

* * * * *